United States Patent
Kainuma et al.

(10) Patent No.: US 7,566,586 B2
(45) Date of Patent: Jul. 28, 2009

(54) METHOD OF MANUFACTURING A SEMICONDUCTOR DEVICE

(75) Inventors: Norio Kainuma, Kawasaki (JP); Hidehiko Kira, Kawasaki (JP); Kenji Kobae, Kawasaki (JP); Kimio Nakamura, Kawasaki (JP); Kuniko Ishikawa, Kawasaki (JP); Yukio Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 359 days.

(21) Appl. No.: 11/634,119

(22) Filed: Dec. 6, 2006

(65) Prior Publication Data
US 2007/0264752 A1    Nov. 15, 2007

(30) Foreign Application Priority Data
May 11, 2006    (JP)    .............................. 2006-132967

(51) Int. Cl.
*H01L 21/00*    (2006.01)
(52) U.S. Cl. ................. 438/108; 257/E21.503
(58) Field of Classification Search ................... 438/108
See application file for complete search history.

(56) References Cited

U.S. PATENT DOCUMENTS

| | | | | |
|---|---|---|---|---|
| 6,133,066 A * | 10/2000 | Murakami | .................... | 438/108 |
| 6,368,895 B1 * | 4/2002 | Hori | ............................ | 438/108 |
| 6,518,096 B2 * | 2/2003 | Chan et al. | ................... | 438/118 |
| 6,653,171 B2 * | 11/2003 | Ikegami | ....................... | 438/120 |
| 6,687,738 B1 * | 2/2004 | Hutton et al. | ................ | 709/204 |
| 2002/0016022 A1 * | 2/2002 | Shintani | ...................... | 438/108 |
| 2002/0072149 A1 * | 6/2002 | Yoshida | ....................... | 438/108 |
| 2003/0001286 A1 * | 1/2003 | Kajiwara et al. | ............ | 257/778 |

FOREIGN PATENT DOCUMENTS

| | | |
|---|---|---|
| CN | 10-67916 | 3/1998 |
| JP | 2004-356419 | 12/2004 |

OTHER PUBLICATIONS

Office Action dated Apr. 17, 2009 corresponding to Chinese application No. 200710001218.9.

* cited by examiner

*Primary Examiner*—David A Zarneke
(74) *Attorney, Agent, or Firm*—Kratz, Quintos & Hanson, LLP (57) ABSTRACT

A method of manufacturing a semiconductor device flip-chip bonds electrode terminals of a substrate and a semiconductor chip together by solid-phase diffusion and underfills a gap between the substrate and the semiconductor chip with a thermosetting resin without the bonds between the terminals breaking due to heat in an underfill hardening step. The method includes a bonding step of flip-chip bonding the electrode terminals of the substrate and the semiconductor chip by solid-phase diffusion, an underfill filling step of filling the gap between the substrate and the semiconductor chip with the underfill material, and the underfill hardening step where the underfill material is heated to the hardening temperature to harden the underfill material. During the underfill hardening step, a member with a lower coefficient of thermal expansion out of the substrate and the semiconductor chip is heated to a higher temperature than the other member.

11 Claims, 6 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device that flip-chip bonds together electrode terminals of a substrate and a semiconductor chip by solid-phase diffusion and underfills a gap between the substrate and the semiconductor chip using thermosetting resin.

2. Related Art

In recent years, when mounting a semiconductor chip on a substrate (circuit board) by flip-chip bonding during the manufacturing of a semiconductor device such as a semiconductor package, a method is used where electrode terminals such as bumps of the semiconductor chip and electrode terminals such as pads of the substrate are placed in contact and the electrode terminals are bonded together by solid-phase diffusion. As specific methods of bonding together the electrode terminals by solid-phase diffusion, when the electrode terminals of the substrate and the electrode terminals of the semiconductor chip have been placed in contact, it is possible to use an ultrasonic bonding method where ultrasonic vibration is applied to the semiconductor chip or room-temperature surface-activated bonding that applies pressure across the electrode terminals.

In Patent Document 1, a conventional method of manufacturing a semiconductor device using ultrasonic bonding is disclosed. The method of manufacturing a semiconductor device disclosed in Patent Document 1 is described below.

Figures 5A, 5B:
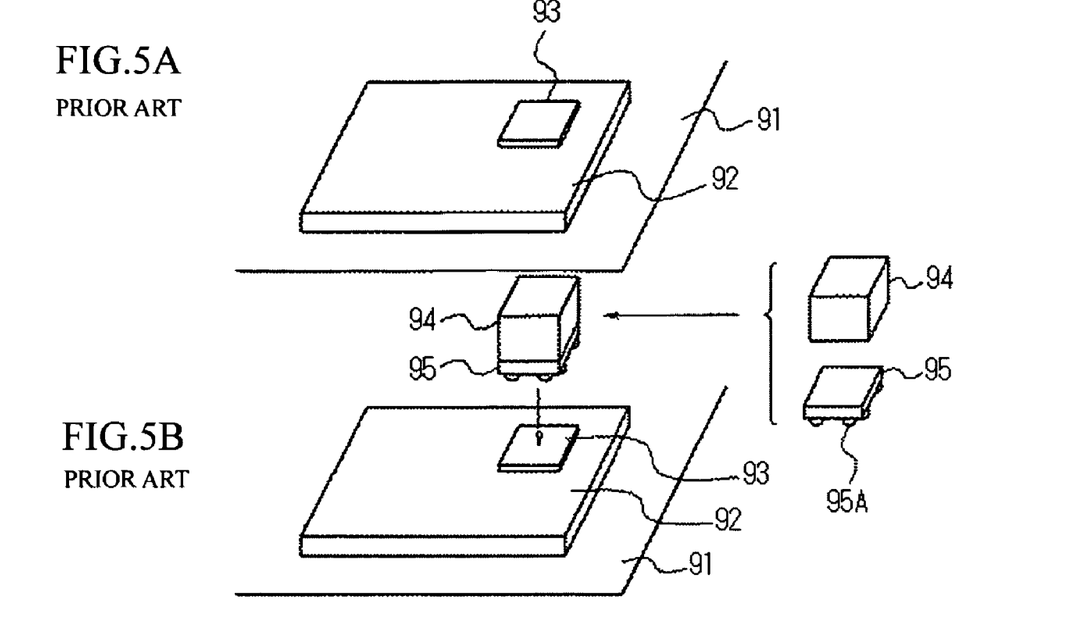
FIGS. 5A to 5D are diagrams useful in explaining a conventional method of manufacturing a semiconductor device.

First, as shown in FIG. 5A, a substrate 92 on which a semiconductor chip will be mounted is placed on a stage 91. When doing so, underfill material (UF material) 93 is stuck or applied onto lead portions that are disposed on the substrate 92 and used to electrically connect the chip. Here, the temperature of the UF material 93 is kept constant at the UF material softening temperature by heating via the stage 91.

Next, as shown in FIG. 5B, a chip 95 that is disposed on a tray or the like and has gold (Au) bumps 95A attached thereto is attached by suction to a base surface of a horn 94 used to apply ultrasonic vibration, the horn 94 on which the chip 95 is held is aligned with the substrate 92 on the stage 91, and then the horn 94 is lowered onto the UF material 93. The temperature of the horn 94 (or the chip 95) at this time is set at a temperature where the UF material 93 softens but does not harden.

Figure 5C:
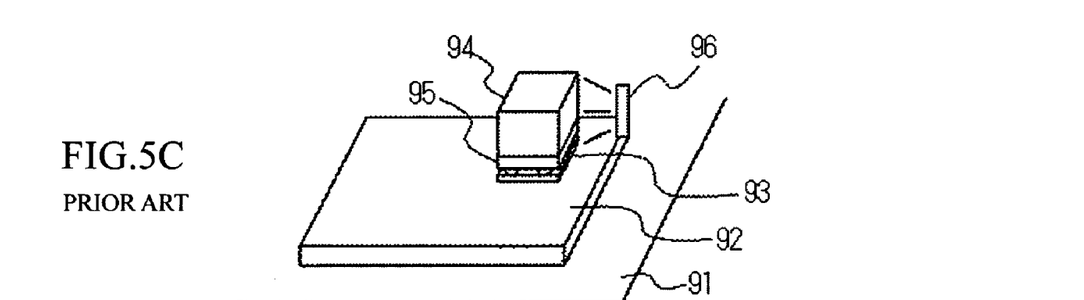

After this, as shown in FIG. 5C, after the chip 95 has been transferred onto the UF material 93, the UF material 93 turns into a gel due to the heat from above and below, and by carrying out ultrasonic thermocompression bonding at the hardening reaction temperature or below, the gold bumps 95A and the lead connection portions are joined. After such metal joining has been completed, heat energy is applied by a heating apparatus 96 provided outside the chip holding mechanism to the UF material 93 that forms a resin portion to produce the hardening reaction temperature of the UF material 93.

Figure 5D:
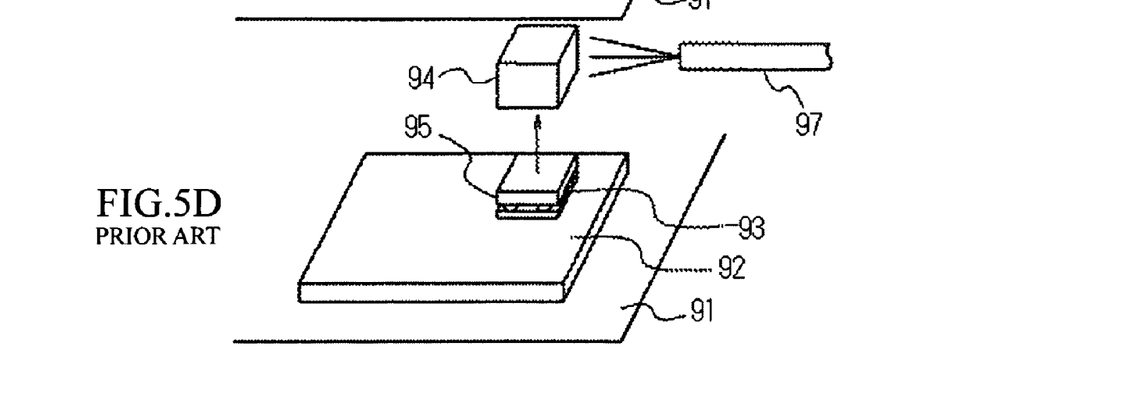

In addition, as shown in FIG. 5D, when the hardening of the UF material 93 has been completed, the horn 94 releases the chip 95 from attachment and is raised. When doing so, since the temperature of the horn 94 has been raised to close to the hardening reaction temperature of the UF material 93, the horn is cooled by a cooling apparatus 97 provided separately to the horn 94 and thereby lowered to a predetermined temperature.

By doing so, one chip 95 on which gold bumps 95A have been formed can be flip-chip mounted on lead connecting portions of a substrate 92 or the like onto which UF material 93 has been supplied in advance.

Figure 6A:
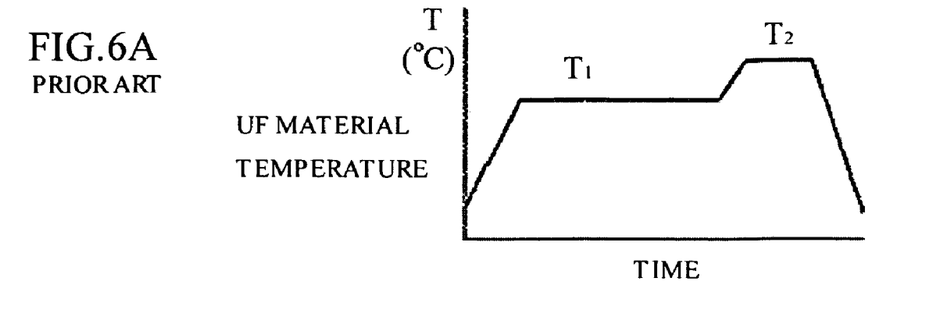
FIGS. 6A to 6D are characteristics graphs showing the temperature, load, and the like of the various manufacturing members in the conventional method of manufacturing a semiconductor device.

FIGS. 6A to 6D are characteristics graphs showing the temperature, load, and the like of the manufacturing members shown in FIGS. 5A to 5D. First, the UF material 93 is applied onto or stuck onto the substrate 92 placed on the stage 91 so as to cover the connection terminals (leads) for connecting the chip 95, and when doing so, as shown in FIG. 6A, the temperature of the UF material 93 rises to the softening temperature $T_1$ of the UF material. After the softening temperature $T_1$ of the UF material has been reached, the temperature becomes substantially constant. When the UF material 93 turns into a gel and the temperature of the UF material 93 is raised by the external heating apparatus 96 to reach the hardening temperature $T_2$, the UF material 93 hardens. After the UF material 93 has hardened, since the horn 94 is cooled by the cooling apparatus 97, the temperature of the UF material 93 falls to the initial temperature.

Figure 6B:
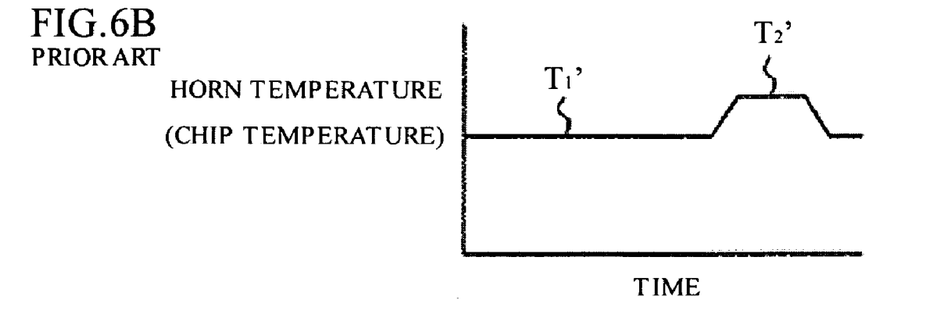

On the other hand, as shown in FIG. 6B, the chip 95 that has been connected and fixed to the substrate 92 is attached by suction to the horn 94 on the rear surface side of the chip 95, and like the horn 94 is kept at a substantially uniform temperature $T_1'$. This temperature $T_1'$ is kept constant during the application of ultrasound (US) so that the amplitude of the ultrasonic vibration of the horn is kept constant. When the horn temperature is raised to $T_2'$ by the external heating apparatus 96, the UF material 93 reaches the hardening temperature $T_2$. After the UF material 93 has hardened, the temperature of the horn 94 is again kept uniform at the temperature $T_1'$.

Figure 6C:
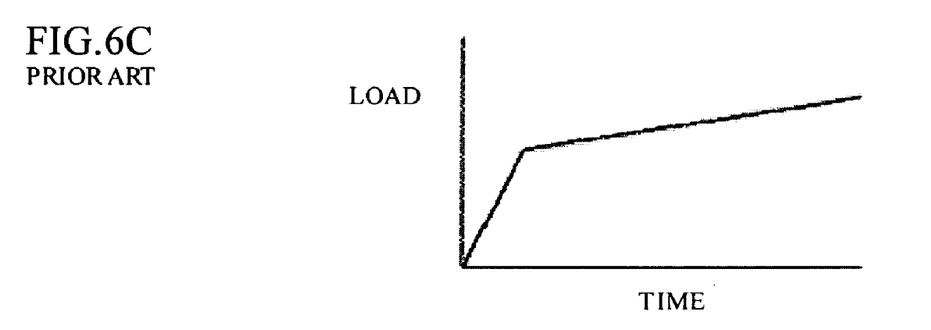

Also, as shown in FIG. 6C, the load applied to the chip when the chip is connected to the substrate is set so as to obtain characteristics that enable the ultrasonic energy to be efficiently transmitted.

Figure 6D:
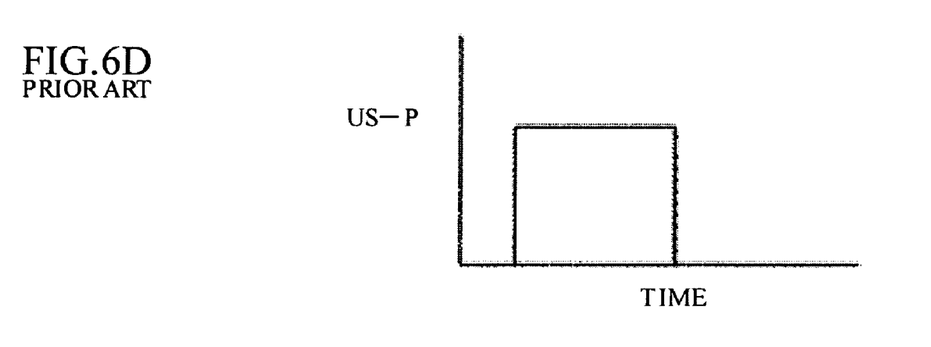

As shown in FIG. 6D, the timing for producing the ultrasonic vibration applied to the horn 94 is set at the point where the applied load reaches an optimal load for connecting the gold bumps and the leads.

Patent Document 1

Japanese Laid-Open Patent Publication No. 2004-356419 (Paragraphs 0016 to 0020, 0031 to 0034, and FIGS. 1 and 4)

SUMMARY OF THE INVENTION

However, the method of manufacturing a semiconductor device disclosed in Patent Document 1 has the following problem.

A substrate composed mainly of resin and a semiconductor chip composed mainly of silicon have greatly different coefficients of thermal expansion (rates of thermal expansion). For example, the coefficient of thermal expansion of a substrate composed mainly of resin is often around 15 ppm and the coefficient of thermal expansion of a semiconductor chip composed mainly of silicon is often around 3 ppm. This means that there is the problem that when heating is carried out to harden the underfill material after the connection terminals of the chip and the substrate have been ultrasonically bonded (by solid-phase diffusion), the substrate and the semiconductor chip will thermally expand by different amounts, which can cause the connection terminals that have been bonded together to break.

The present invention was conceived to solve the problem described above and it is an object of the present invention to provide a method of manufacturing a semiconductor device that flip-chip bonds electrode terminals of a substrate and a semiconductor chip together by solid-phase diffusion and underfills a gap between the substrate and the semiconductor chip using thermosetting resin without the bonds between the terminals breaking due to the heat applied in a step of hardening the underfill material.

To solve the problem described above, the method of bonding a semiconductor chip according to the present invention includes a bonding step of flip-chip bonding electrode terminals of a substrate and electrode terminals of a semiconductor chip by solid-phase diffusion; an underfill filling step of filling a gap between the substrate and the semiconductor chip with an underfill material composed of thermosetting resin; and an underfill hardening step of heating the underfill material to a hardening temperature to harden the underfill material, wherein in the underfill hardening step, a member with a lower coefficient of thermal expansion out of the substrate and the semiconductor chip is heated to a higher temperature than the other member out of the substrate and the semiconductor chip.

By doing so, during the heating in the underfill hardening step, the difference in the amounts by which the substrate and the semiconductor chip expand is reduced, which makes it possible to prevent the bonds between the electrode terminals of the substrate and the semiconductor chip from breaking.

Also, in the underfill hardening step, respective heating temperatures of the substrate and the semiconductor chip may be set so that the substrate and the semiconductor chip expand by the same amount.

By doing so, the substrate and the semiconductor chip will expand by the same amount, which makes it possible to more favorably prevent the bonds between the electrode terminals of the substrate and the semiconductor chip from breaking.

The semiconductor chip may have a lower coefficient of thermal expansion than the substrate, and in the underfill hardening step, the semiconductor chip and the underfill material may be heated to harden the underfill material by placing a heating member in contact with or close to an opposite surface of the semiconductor chip to a surface on which the electrode terminals are formed.

By doing so, it is possible to heat the semiconductor chip that has a low coefficient of thermal expansion to a higher temperature using a simple construction.

In the bonding step, the electrode terminals of the substrate and the electrode terminals of the semiconductor chip may be placed in contact and ultrasonic vibration may be applied to the semiconductor chip to bond the electrode terminals together by solid-phase diffusion.

Another method of manufacturing a semiconductor device includes: an underfill applying step of applying an underfill material composed of thermosetting resin onto a formation surface of electrode terminals on a substrate; a bonding step of flip-chip bonding the electrode terminals of the substrate and electrode terminals of a semiconductor chip by solid-phase diffusion; and an underfill hardening step of heating the underfill material to a hardening temperature to harden the underfill material, wherein in the underfill hardening step, a member with a lower coefficient of thermal expansion out of the substrate and the semiconductor chip is heated to a higher temperature than the other member out of the substrate and the semiconductor chip.

By doing so, during the heating in the underfill hardening step, the difference in the amounts by which the substrate and the semiconductor chip expand is reduced, which makes it possible to prevent the bonds between the electrode terminals of the substrate and the semiconductor chip from breaking.

Also, in the underfill hardening step, respective heating temperatures of the substrate and the semiconductor chip may be set so that the substrate and the semiconductor chip expand by the same amount.

By doing so, the substrate and the semiconductor chip will expand by the same amount, which makes it possible to more favorably prevent the bonds between the electrode terminals of the substrate and the semiconductor chip from breaking.

The semiconductor chip may have a lower coefficient of thermal expansion than the substrate, and in the underfill hardening step, the semiconductor chip and the underfill material may be heated to harden the underfill material by placing a heating member in contact with or close to an opposite surface of the semiconductor chip to the formation surface of the electrode terminals.

By doing so, it is possible to heat the semiconductor chip that has a low coefficient of thermal expansion to a higher temperature using a simple construction.

In the bonding step, the electrode terminals of the substrate and the electrode terminals of the semiconductor chip may be placed in contact and ultrasonic vibration may be applied to the semiconductor chip to bond the electrode terminals together by solid-phase diffusion.

Another method of manufacturing a semiconductor device includes: a bonding step of flip-chip bonding electrode terminals of a substrate and electrode terminals of a semiconductor chip by solid-phase diffusion; an underfill filling step of filling a gap between the substrate and the semiconductor chip with an underfill material composed of thermosetting resin; and an underfill hardening step of heating the underfill material to a hardening temperature to harden the underfill material, wherein in the bonding step, bonding is carried out with a member with a higher coefficient of thermal expansion out of the substrate and the semiconductor chip being heated to a higher temperature than the other member out of the substrate and the semiconductor chip.

In this way, by heating a member with a higher coefficient of thermal expansion out of the substrate and the semiconductor chip to a higher temperature in advance during the bonding step, it is possible to suppress the amount by which the member with the higher coefficient of thermal expansion expands due to the heating carried out during the underfill hardening step, which makes it possible to prevent the bonds between the electrode terminals of the substrate and the semiconductor chip from breaking.

Also, in the bonding step, the heating temperature of the member with the higher coefficient of thermal expansion may be no greater than the heating temperature of the underfill layer in the underfill hardening step.

By doing so, it is possible to prevent the member with the higher coefficient of thermal expansion that has been heated in the bonding step from shrinking during the heating in the underfill hardening step.

In the bonding step, the electrode terminals of the substrate and the electrode terminals of the semiconductor chip may be placed in contact and ultrasonic vibration may be applied to the semiconductor chip to bond the electrode terminals together by solid-phase diffusion.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

Preferred embodiments of a method of manufacturing a semiconductor device according to the present invention will now be described with reference to the attached drawings.

First Embodiment

Figure 1A:
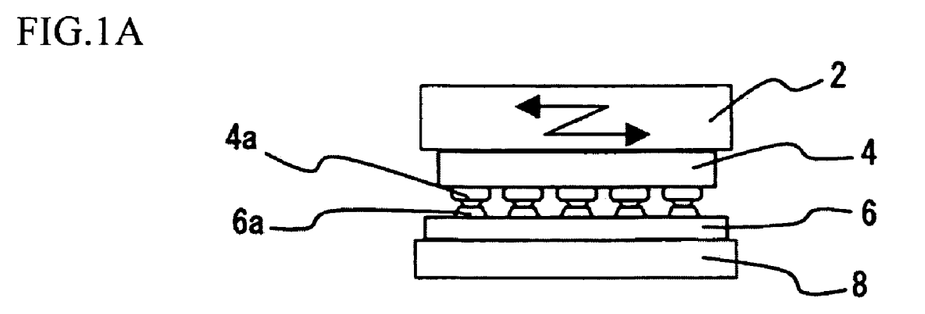
FIGS. 1A to 1C are diagrams useful in explaining a method of manufacturing a semiconductor device according to a first embodiment of the present invention.
Figure 1B:
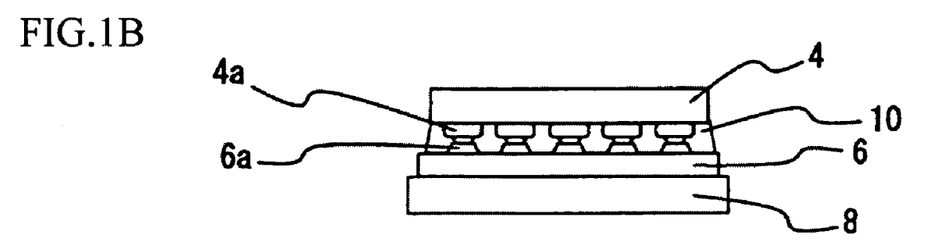
Figure 1C:
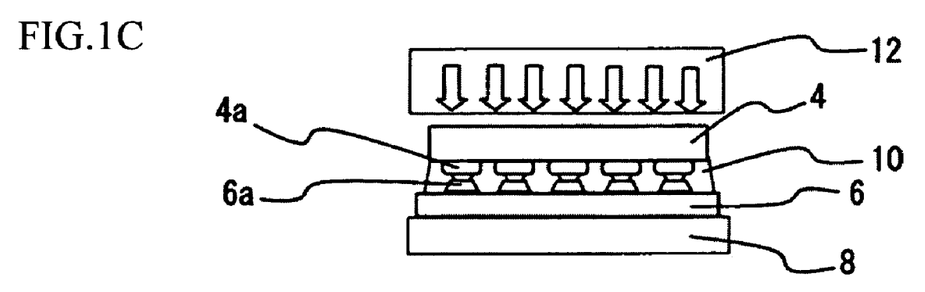

FIGS. 1A to 1C are diagrams useful in explaining a method of manufacturing a semiconductor device according to a first embodiment of the present invention.

Bonding Process

First, as shown in FIG. 1A, a substrate 6 is placed on a stage 8, a semiconductor chip 4 is held by suction on an ultrasonic head 2, bumps 4a as electrode terminals of the semiconductor chip 4 and pads 6a as electrode terminals of the substrate 6 are aligned and placed in contact, and ultrasonic vibration is applied to the ultrasonic head 2 by an ultrasonic vibrating apparatus, not shown, to bond together the bumps 4a and the pads 6a by solid-phase diffusion.

Underfill Filling Process

Next, as shown in FIG. 1B, the gap between the substrate 6 and the semiconductor chip 4 is filled with underfill material 10 composed of thermosetting resin. The underfill material 10 used to fill the gap is heated in advance to the softening temperature and therefore has sufficient fluidity. When doing so, if the temperature of the underfill material 10 is lower than an appropriate softening temperature, there is the risk that the underfill material 10 will have high viscosity and will therefore not spread out into minute gaps between the electrode terminals, resulting in the risk that air foam will be produced. It should be obvious that the softening temperature is lower than the hardening temperature at which the thermosetting resin hardens. Note that the softening temperature of a typical thermosetting resin used as the underfill material 10 is around 70° C. to 100° C.

Underfill Hardening Process

Next, as shown in FIG. 1C, a heating member 12 is placed in contact with or close to an opposite surface of the semiconductor chip 4 to the bump 4a formation surface to heat the semiconductor chip 4 and at the same time the stage 8 is heated to heat the substrate 6. By doing so, the underfill material 10 is heated to the hardening temperature or above and therefore hardens. Note that the hardening temperature of a typical thermosetting resin used as the underfill material 10 is around 150° C.

In this underfill hardening process, the material with the lower coefficient of thermal expansion out of the substrate 6 and the semiconductor chip 4 is heated to a higher temperature.

As one example, assume that the semiconductor chip 4 is composed mainly of silicon and has a coefficient of thermal expansion of 3 ppm and that the substrate 6 is composed mainly of resin and has a coefficient of thermal expansion of 15 ppm. In this case, the semiconductor chip 4 that has the lower coefficient of thermal expansion will be heated to a higher temperature than the substrate 6.

More preferably, the heating temperatures of the substrate 6 and the semiconductor chip 4 are set so as to make the amounts by which the substrate 6 and the semiconductor chip 4 expand due to heat equal. This is described in more detail below.

Assume the temperature of the substrate 6 and the semiconductor chip 4 during the bonding process is 100° C. and that the semiconductor chip 4 is heated to 160° C. by the heating member 12 during the underfill hardening process. If the coefficient of thermal expansion of the semiconductor chip 4 is 3 ppm and the coefficient of thermal expansion of the substrate 6 is 15 ppm, by heating the substrate 6 to a temperature $t_6$ that satisfies the equation 3 ppm×(160° C.−100° C.)=15 ppm×($t_6$−100° C.), or in other words, by heating the substrate 6 to 112° C., it is possible to make the semiconductor chip 4 and the substrate 6 thermally expand by the same amount.

Normally, if the temperature of the substrate 6 and the semiconductor chip 4 during the bonding process is expressed as t, the heating temperature during the underfill hardening process and the coefficient of thermal expansion of the semiconductor chip 4 are respectively expressed as $t_4$ and $k_4$, and the heating temperature during the underfill hardening process and the coefficient of thermal expansion of the substrate 6 are respectively expressed as $t_6$ and $k_6$, by setting t, $t_4$, and $t_6$ so as to satisfy the equation $k_4 \times (t_4-t) = k_6 \times (t_6-t)$, it is possible to make the amount by which the substrate 6 and the semiconductor chip 4 expand due to the heating during the underfill hardening process equal.

Note that the present invention is not limited to satisfying the equation given above, and even if the equation is not satisfied, by heating the member with the lower coefficient of thermal expansion out of the substrate 6 and the semiconductor chip 4 to a higher temperature during the underfill hardening process, it is possible to suppress the difference in thermal expansion between the substrate 6 and the semiconductor chip 4.

In the example described above, the heating temperature of the substrate 6 is 112° C. which is lower than the hardening temperature of the underfill material 10, but since the volume and the heat capacity of the semiconductor chip 4 are normally extremely low compared to the substrate 6, by heating the semiconductor chip 4 to the hardening temperature or higher, it is possible to heat the underfill material 10 to the hardening temperature.

Note that when it is possible to heat the underfill material 10 to the hardening temperature by heating only the semiconductor chip 4, the stage 8 does not need to be heated.

According to the method of manufacturing a semiconductor device according to the first embodiment, when heating during the underfill hardening process, the difference in the amounts by which the substrate 6 and the semiconductor chip 4 expand is reduced or the amounts of expansion are made equal, thereby making it possible to prevent the bonds between the electrode terminals 6a, 4a of the substrate 6 and the semiconductor chip 4 from breaking.

Second Embodiment

Figure 2A:
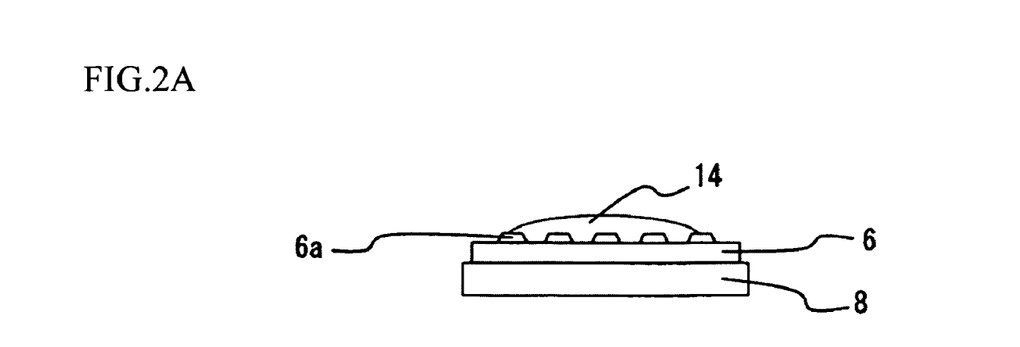
FIGS. 2A to 2C are diagrams useful in explaining a method of manufacturing a semiconductor device according to a second embodiment of the present invention.
Figure 2B:
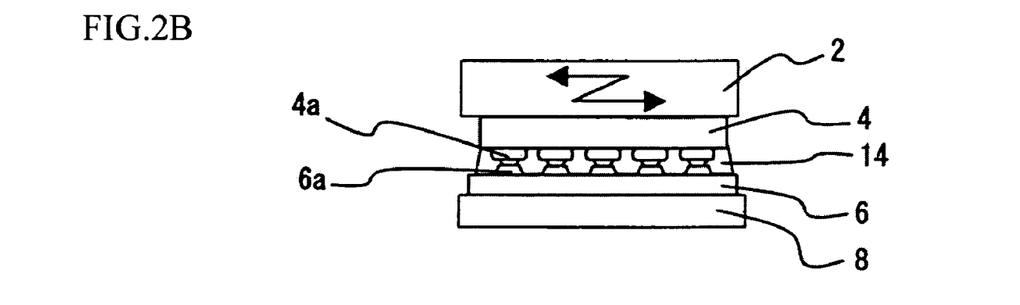
Figure 2C:
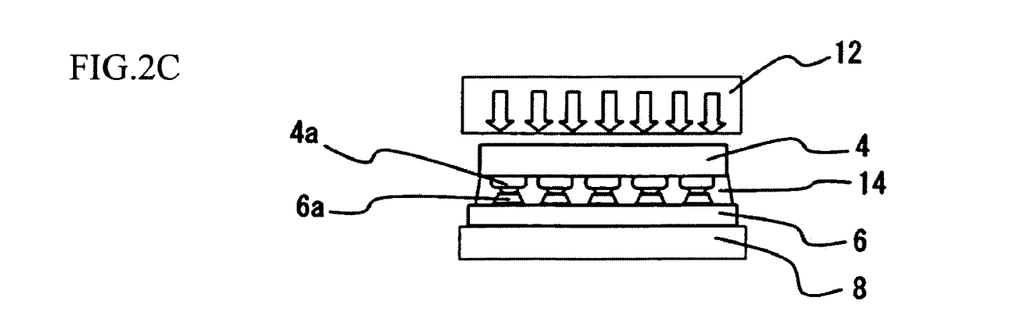

FIGS. 2A to 2C are diagrams useful in explaining a method of manufacturing a semiconductor device according to a second embodiment of the present invention.

Note that in the second embodiment, components that are the same as in the first embodiment have been assigned the same reference numerals and description thereof has been omitted.

Underfill Applying Process

First, as shown in FIG. 2A, the substrate 6 is placed on the stage 8 and underfill material 14 composed of thermosetting resin is applied onto the formation surface of the electrode terminals (the pads 6a) of the substrate 6. The applied underfill material 14 is heated in advance to the softening temperature and therefore has sufficient fluidity.

Bonding Process

Next, as shown in FIG. 2B, the semiconductor chip 4 is held by suction on the ultrasonic head 2, the bumps 4a as the electrode terminals of the semiconductor chip 4 and the pads 6a as the electrode terminals of the substrate 6 are aligned and placed in contact, and ultrasonic vibration is applied to the ultrasonic head 2 by an ultrasonic vibrating apparatus, not shown, to bond together the bumps 4a and the pads 6a by solid-phase diffusion.

Underfill Hardening Process

Next, as shown in FIG. 2C, the heating member 12 is placed in contact with or close to an opposite surface of the semiconductor chip 4 to the bump 4a formation surface to heat the semiconductor chip 4 and at the same time the stage 8 is heated to heat the substrate 6. By doing so, the underfill material 14 is heated to the hardening temperature or above and therefore hardens.

Note that since the underfill hardening process has the same composition as in the first embodiment, description thereof has been omitted.

The method of manufacturing a semiconductor device according to the second embodiment can achieve the same effects as the first embodiment.

Note that in the method of manufacturing a semiconductor device according to the second embodiment, in the bonding process shown in FIG. 2B, it would be conceivable to use a construction where the ultrasonic head 2 is also used as the heating member and the ultrasonic bonding of the electrode terminals 4a, 6a and the hardening of the underfill material 14 are carried out simultaneously by the ultrasonic head 2 that has been heated in advance.

However, such construction is not preferable since underfill material 14 that has leaked out from between the semiconductor chip 4 and the substrate 6 can adhere to and harden on the ultrasonic head 2, which makes it necessary to carry out a process that removes the hardened underfill material from the ultrasonic head 2.

Third Embodiment

Figure 3A:
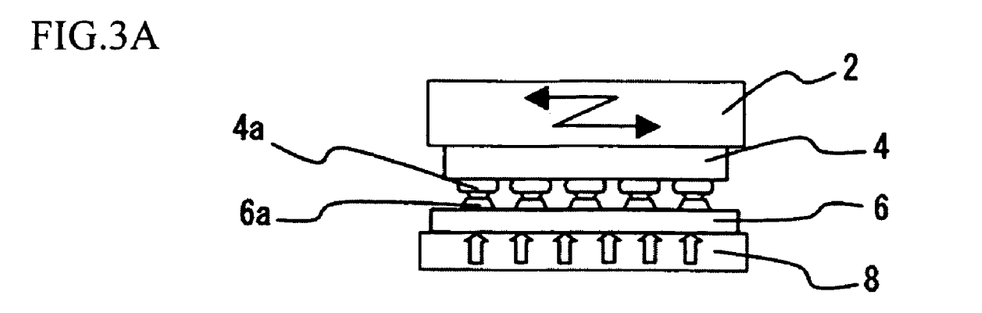
FIGS. 3A to 3C are diagrams useful in explaining a method of manufacturing a semiconductor device according to a third embodiment of the present invention.
Figure 3B:
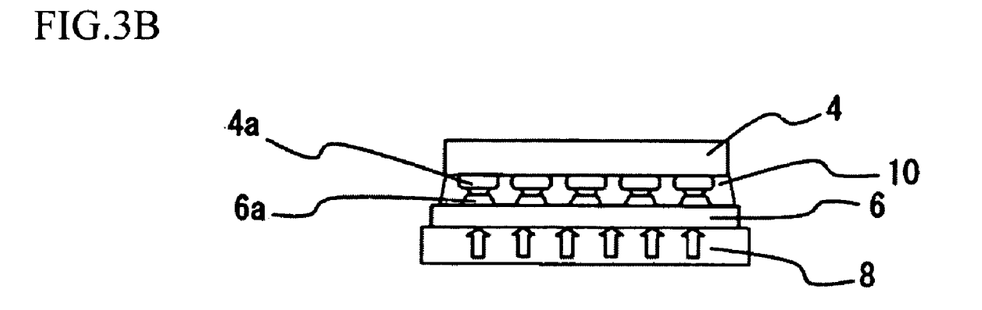
Figure 3C:
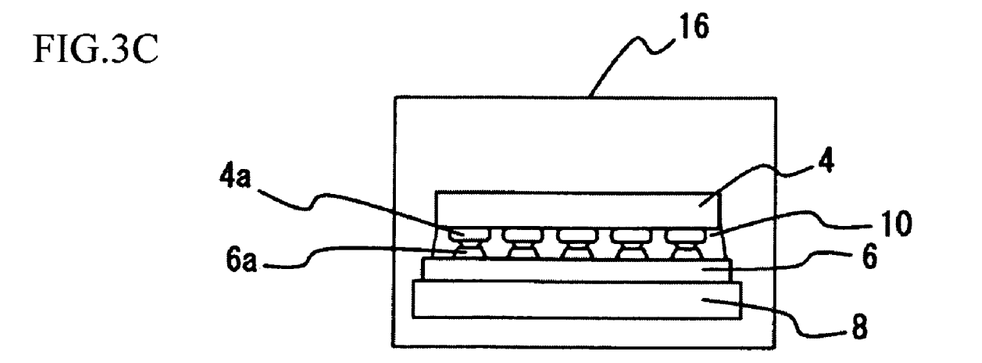

FIGS. 3A to 3C are diagrams useful in explaining a method of manufacturing a semiconductor device according to a third embodiment of the present invention.

Note that in the third embodiment, components that are the same as in the first embodiment have been assigned the same reference numerals and description thereof has been omitted.

Bonding Process

First, as shown in FIG. 3A, the substrate 6 is placed on the stage 8. The stage 8 is heated in advance, and therefore the substrate 6 placed thereupon is heated. The semiconductor chip 4 is then held by suction on the ultrasonic head 2, the bumps 4a as the electrode terminals of the semiconductor chip 4 and the pads 6a as the electrode terminals of the substrate 6 are aligned and placed in contact, and ultrasonic vibration is applied to the ultrasonic head 2 via an ultrasonic vibrating apparatus, not shown, to bond together the bumps 4a and the pads 6a by solid-phase diffusion.

Underfill Filling Process

Next, as shown in FIG. 3B, the gap between the substrate 6 and the semiconductor chip 4 is filled with the underfill material 10 composed of thermosetting resin. The underfill material 10 used to fill the gap is heated in advance to the softening temperature and therefore has sufficient fluidity.

Underfill Hardening Process

Next, as shown in FIG. 3C, the semiconductor device is inserted into and heated by a hardening furnace 16 to heat the underfill material 10 to the hardening temperature or above to harden the underfill material 10.

Preferably the heating temperature of the substrate 6 during bonding is set so that when the semiconductor device is heated in the hardening furnace 16, the electrode terminals 4a, 6a of the substrate 6 expand by the same amount relative to the sizes thereof during bonding. This is described in more detail below.

Assume that in the bonding process, the temperature of the semiconductor chip 4 is 70° C. and that in the underfill hardening process, the semiconductor chip 4, the substrate 6, and the underfill material 10 are heated to 150° C. If the coefficient of thermal expansion of the semiconductor chip 4 is 3 ppm and the coefficient of thermal expansion of the substrate 6 is 15 ppm, by heating the substrate 6 in advance during bonding to the temperature $t_6$ that satisfies the equation 3 ppm×(150° C.−70° C.)=15 ppm×(150° C.−$t_6$) or in other words, by heating the substrate 6 to 134° C., it is possible to have the substrate 6 and the semiconductor chip 4 expand by the same amount during heating in the hardening furnace 16 relative to the sizes of the substrate 6 and the semiconductor chip 4 during bonding.

Normally, if the temperature of the substrate 6 during the bonding process is expressed as $t_6$, the temperature of the semiconductor chip 4 during the bonding process is expressed as $t_4$, the heating temperature during the underfill hardening process is expressed as t, the coefficient of thermal expansion of the semiconductor chip 4 is expressed as $k_4$, and the coefficient of thermal expansion of the substrate 6 is expressed as $k_6$, by setting t, $t_4$, and $t_6$ so as to satisfy the equation $k_4 \times (t-t_4) = k_6 \times (t-t_6)$, it is possible to have the substrate 6 and the semiconductor chip 4 expand by the same amount due to the heating during the underfill hardening process.

Note that the present invention is not limited to satisfying the equation given above, and even if the equation is not satisfied, by heating the member with the higher coefficient of thermal expansion out of the substrate 6 and the semiconductor chip 4 to a higher temperature in advance during the bonding process, it is possible to suppress the difference in thermal expansion between the substrate 6 and the semiconductor chip 4 during the underfill hardening process.

According to the method of manufacturing a semiconductor device according to the third embodiment, when heating during the underfill hardening process, the difference in the amounts by which the substrate 6 and the semiconductor chip 4 expand is reduced or the amounts of expansion are made equal, thereby making it possible to prevent the bonds between the electrode terminals 6a, 4a of the substrate 6 and the semiconductor chip 4 from breaking.

Fourth Embodiment

Figure 4A:
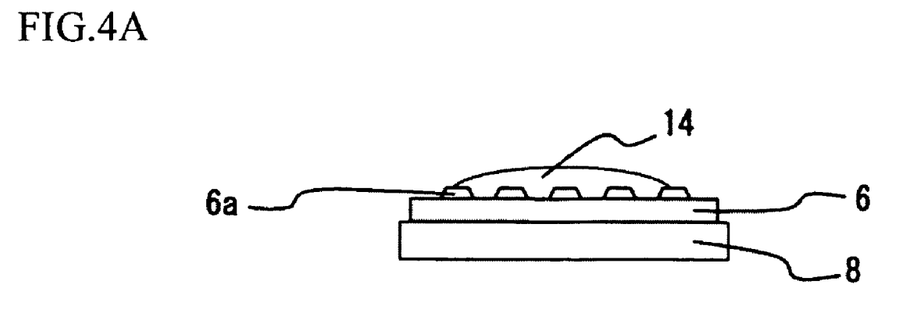
FIGS. 4A to 4C are diagrams useful in explaining a method of manufacturing a semiconductor device according to a fourth embodiment of the present invention.
Figure 4B:
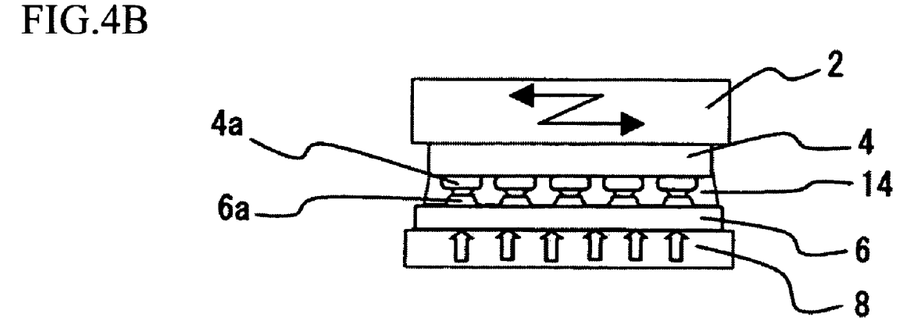
Figure 4C:
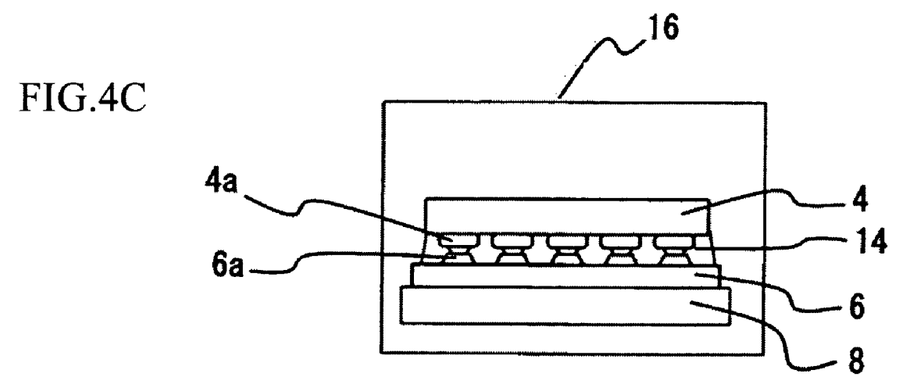

FIGS. 4A to 4C are diagrams useful in explaining the method of manufacturing a semiconductor device according to a fourth embodiment of the present invention.

Note that in the fourth embodiment, components that are the same as in the first embodiment have been assigned the same reference numerals and description thereof has been omitted.

Underfill Applying Process

First, as shown in FIG. 2A, the substrate 6 is placed on the stage 8 and underfill material 14 composed of thermosetting resin is applied onto the formation surface of the electrode terminals (the pads 6a) of the substrate 6. The applied underfill material 14 is heated in advance to the softening temperature and therefore has sufficient fluidity.

Bonding Process

Next, as shown in FIG. 4B, the substrate 6 is heated by heating the stage 8. Next, the semiconductor chip 4 is held by suction on the ultrasonic head 2, the bumps 4a as the electrode terminals of the semiconductor chip 4 and the pads 6a as the electrode terminals of the substrate 6 are aligned and placed in contact, and ultrasonic vibration is applied to the ultrasonic head 2 via an ultrasonic vibrating apparatus, not shown, to bond together the bumps 4a and the pads 6a by solid-phase diffusion.

Underfill Hardening Process

Next, as shown in FIG. 4C, the semiconductor device is inserted into and heated by a hardening furnace 16 to heat the underfill material 14 to the hardening temperature or above to harden the underfill material 10.

Note that since the heating temperature of the semiconductor chip 4 and the heating temperature of the substrate 6 during the bonding process and the heating temperature of the semiconductor device during the underfill hardening process are the same as in the third embodiment, description thereof has been omitted.

The method of manufacturing a semiconductor device according to the fourth embodiment can achieve the same effects as the third embodiment.

Although in the first to fourth embodiments, a method that uses ultrasonic vibration is used to bond together the electrode terminals 4a, 6a by solid-phase diffusion, the present invention is not limited to this and as one example, it is possible to use room-temperature surface-activated bonding that applies pressure across the electrode terminals.

What is claimed is:

1. A method of manufacturing a semiconductor device comprising:
    a bonding step of flip-chip bonding electrode terminals of a substrate and electrode terminals of a semiconductor chip by solid-phase diffusion;
    an underfill filling step of filling a gap between the substrate and the semiconductor chip with an underfill material composed of thermosetting resin; and
    an underfill hardening step of heating the underfill material to a hardening temperature to harden the underfill material,
    wherein in the underfill hardening step, a member with a lower coefficient of thermal expansion out of the substrate and the semiconductor chip is heated to a higher temperature than the other member out of the substrate and the semiconductor chip.

2. A method of manufacturing a semiconductor device according to claim 1,
    wherein in the underfill hardening step, respective heating temperatures of the substrate and the semiconductor chip are set so that the substrate and the semiconductor chip expand by the same amount.

3. A method of manufacturing a semiconductor device according to claim 1,
    wherein the semiconductor chip has a lower coefficient of thermal expansion than the substrate, and
    in the underfill hardening step, the semiconductor chip and the underfill material are heated to harden the underfill material by placing a heating member in contact with or close to an opposite surface of the semiconductor chip to a surface on which the electrode terminals are formed.

4. A method of manufacturing a semiconductor device according to claim 1,
    wherein in the bonding step, the electrode terminals of the substrate and the electrode terminals of the semiconductor chip are placed in contact and ultrasonic vibration is applied to the semiconductor chip to bond the electrode terminals together by solid-phase diffusion.

5. A method of manufacturing a semiconductor device comprising:
    an underfill applying step of applying an underfill material composed of thermosetting resin onto a formation surface of electrode terminals on a substrate;
    a bonding step of flip-chip bonding the electrode terminals of the substrate and electrode terminals of a semiconductor chip by solid-phase diffusion; and
    an underfill hardening step of heating the underfill material to a hardening temperature to harden the underfill material,
    wherein in the underfill hardening step, a member with a lower coefficient of thermal expansion out of the substrate and the semiconductor chip is heated to a higher temperature than the other member out of the substrate and the semiconductor chip.

6. A method of manufacturing a semiconductor device according to claim 5,
    wherein in the underfill hardening step, respective heating temperatures of the substrate and the semiconductor chip are set so that the substrate and the semiconductor chip expand by the same amount.

7. A method of manufacturing a semiconductor device according to claim 5,
    wherein the semiconductor chip has a lower coefficient of thermal expansion than the substrate, and
    in the underfill hardening step, the semiconductor chip and the underfill material are heated to harden the underfill material by placing a heating member in contact with or close to an opposite surface of the semiconductor chip to the formation surface of the electrode terminals.

8. A method of manufacturing a semiconductor device according to claim 5,
    wherein in the bonding step, the electrode terminals of the substrate and the electrode terminals of the semiconductor chip are placed in contact and ultrasonic vibration is applied to the semiconductor chip to bond the electrode terminals together by solid-phase diffusion.

9. A method of manufacturing a semiconductor device comprising:
- a bonding step of flip-chip bonding electrode terminals of a substrate and electrode terminals of a semiconductor chip by solid-phase diffusion;
- an underfill filling step of filling a gap between the substrate and the semiconductor chip with an underfill material composed of thermosetting resin; and
- an underfill hardening step of heating the underfill material to a hardening temperature to harden the underfill material,
- wherein in the bonding step, bonding is carried out with a member with a higher coefficient of thermal expansion out of the substrate and the semiconductor chip being heated to a higher temperature than the other member out of the substrate and the semiconductor chip.

10. A method of manufacturing a semiconductor device according to claim 9,
- wherein in the bonding step, the heating temperature of the member with the higher coefficient of thermal expansion is no greater than the heating temperature of the underfill layer in the underfill hardening step.

11. A method of manufacturing a semiconductor device according to claim 9,
- wherein in the bonding step, the electrode terminals of the substrate and the electrode terminals of the semiconductor chip are placed in contact and ultrasonic vibration is applied to the semiconductor chip to bond the electrode terminals together by solid-phase diffusion.

* * * * *